United States Patent [19]

Kmetz

[11] 4,203,104
[45] May 13, 1980

[54] PROCEDURE OF BARGRAPH DISPLAY FOR MEASURED QUANTITIES

[75] Inventor: Allan R. Kmetz, Nussbaumen, Switzerland

[73] Assignee: BBC Brown Boveri & Company Limited, Baden, Switzerland

[21] Appl. No.: 909,724

[22] Filed: May 26, 1978

[30] Foreign Application Priority Data

Jul. 29, 1977 [CH] Switzerland ............... 9398/77

[51] Int. Cl.² .................. G02F 1/13; G09F 9/00
[52] U.S. Cl. .................... 340/754; 340/784; 340/802; 340/805
[58] Field of Search ............ 340/805, 802, 784, 754

[56] References Cited

U.S. PATENT DOCUMENTS

| 3,877,017 | 4/1975 | Kawakami et al. | 340/805 X |
| 3,973,252 | 8/1976 | Mitomo et al. | 340/805 X |
| 3,976,362 | 8/1976 | Kawakami | 340/805 X |
| 4,110,665 | 8/1978 | Moore | 340/754 X |
| 4,117,472 | 9/1978 | Freer et al. | 340/805 X |
| 4,121,203 | 10/1978 | Edwards et al. | 340/805 X |

Primary Examiner—David L. Trafton
Attorney, Agent, or Firm—Oblon, Fisher, Spivak, McClelland & Maier

[57] ABSTRACT

A procedure for the display of measured quantities as a bargraph with the help of a row of addressable display elements, whereby the display elements are interconnected on one side into contiguous groups and on the other side according to like position within each group. Either the on-groups, in which all display elements are to be excited, or the mixed group, in which only a part of the display elements are to be excited, are addressed in a rapid alteration imperceptible to the eye of the beholder. The amplitude of the driving voltage across display elements in the mixed group is zero during the strobe interval for the on-groups.

4 Claims, 5 Drawing Figures

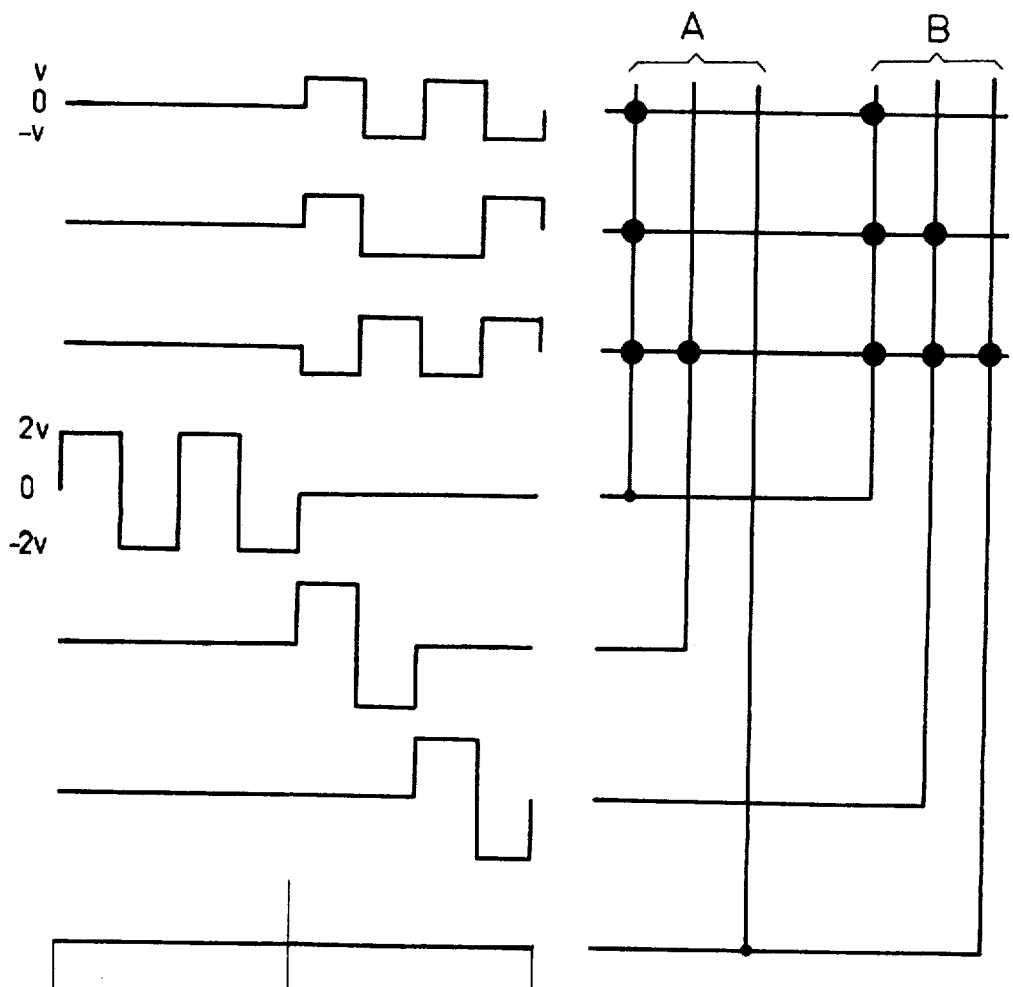
FIG.5
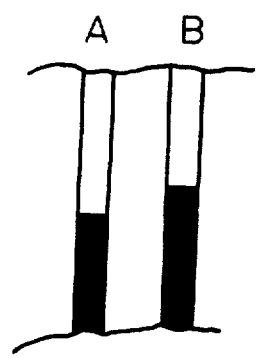

PROCEDURE OF BARGRAPH DISPLAY FOR MEASURED QUANTITIES

BACKGROUND OF THE INVENTION

The invention concerns a procedure for the display of a measured quantity as a bargraph with the help of a linear array of addressable display elements. The display elements are electrically interconnected as a matrix by connecting together the back electrodes of all elements in each contiguous group of elements and by connecting together the front electrodes of one element from every group. The ON-groups, which are to have all their elements turned on, are addressed together during one time interval and the single mixed group, containing some selected and some unselected elements, is addressed during a second time interval, these intervals alternating at a repetition rate too high to be perceived by the eye.

Such a procedure is known from the German "Offenlegungsschrift" 24 08 062. It is shown therein that all On-groups can be strobed together because they all have the same pattern of selected elements. The mixed group is strobed subsequently, and the OFF-groups are not strobed at all because none of their elements are to be excited. Consequently the duty ratio is about 50%, independent of the resolution of the bargraph display.

It is known, for example from the article "Matrix Addressing of Non-emissive Displays" by A. R. Kmetz in the book *Nonemissive Electrooptic Displays*, Plenum, New York (1976) pg. 261 ff., that a pseudo-analog bargraph display consisting of a linear arrangement of liquid crystal (LC) elements can be advantageously interconnected electrically into N groups, each containing M adjacent elements, to form an N×M matrix. With conventional multiplex addressing of a matrix, the N groups are sequentially strobed while the data corresponding to the desired pattern to be displayed in the strobed group is synchronously presented in parallel to the M segment lines. Since the liquid crystal responds to the effective value of the applied voltage, the voltage discrimination ratio (display quality) G is deleteriously influenced by the low duty ratio 1/N which necessarily accompanies a large number of strobed lines:

$$G \leq \sqrt{\frac{\sqrt{N}+1}{\sqrt{N}-1}},$$

where G is defined as the quotient of the effective value of the voltage seen by a selected element divided by the effective value of the voltage seen by an unselected element. (For a derivation of this formula, see the aforementioned article, pg. 272, equation 12.) For a given liquid crystal display, the attainable contrast is determined by the voltage discrimination ratio as shown schematically in FIG. 7, pg. 273, of the said article.

However, as indicated above, a bargraph is much simpler to address than a general matrix: there are then only three types of group, and the duty ratio is generally 50%.

Typical waveforms for such an addressing scheme corresponding to the state of the art according to DOS 24 08 062 are shown in FIG. 1. From these pulse diagrams, one can compute the voltage discrimination ratio G between selected and unselected elements of the mixed group:

$$G = \sqrt{\underbrace{\frac{v^2 + (3v)^2}{v^2 + v^2}}_{\text{ON} \quad \text{MIX}}} = \sqrt{5} = 2.24$$

In this equation, the terms in numerator and denominator arising from the first and second time intervals in FIG. 1 have purposely been separated and labelled with "on" and "mix". Also in FIG. 1, the amplitude of the drive signal for the segment electrodes is designated with V, while the groups and segments themselves are identified by Gr and Sg, respectively.

SUMMARY OF THE INVENTION

Accordingly, it is an object of the invention to substantially improve the voltage discrimination ratio, and therewith the contrast of the display, without a significant increase in cost or complexity. This is achieved through the choice of voltage waveforms which cause the first term ($v^2$) in numerator and denominator of the foregoing equation to vanish. The invention is thereby characterized, in that the driving voltage across display elements in the mixed group is zero during the time interval in which the on-groups are strobed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5 shows waveforms for the addressing signals of display elements in two mixed groups with V=2v.

DESCRIPTION OF THE PREFERRED EMBODIMENTS

The invention will now be more closely described with the help of FIGS. 2–5. It follows immediately from the waveforms shown in FIG. 2 for the addressing signals of display elements in the mixed group that the voltage discrimination ratio is $$G = \sqrt{\frac{(3v)^2}{v^2}} = 3.$$

The equation holds for any duration $\tau$ of the strobe interval for the on-groups.

Figure 2:
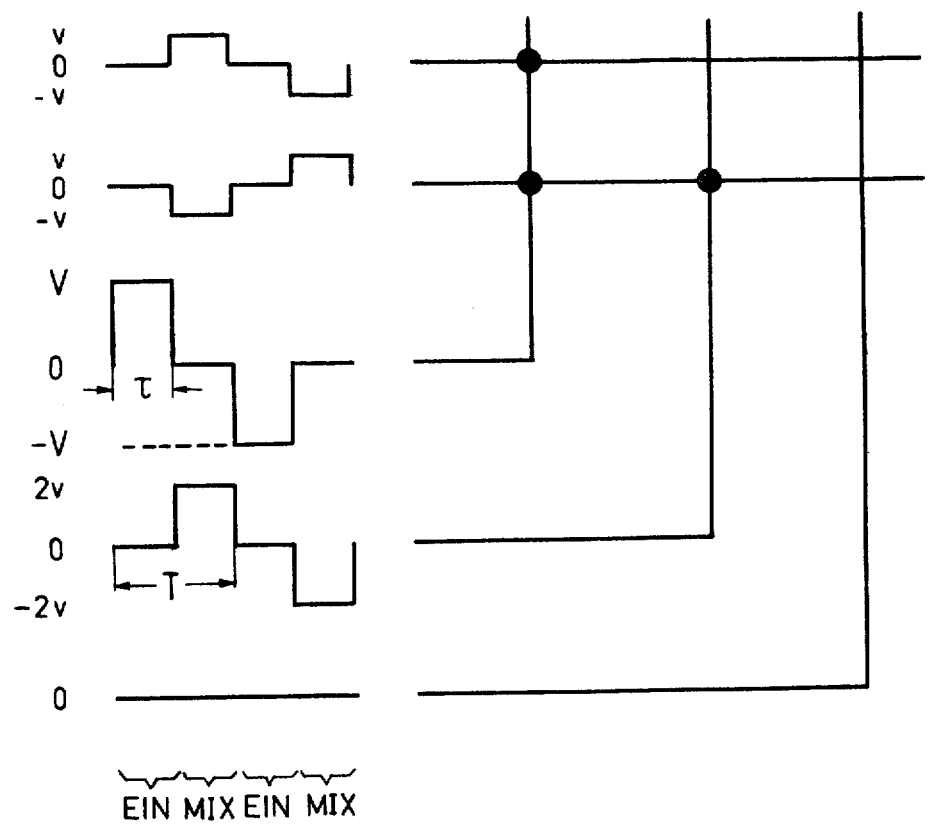
FIG. 2 shows waveforms for the addressing signals of display elements in the mixed groups.

In FIG. 2, ±V is the amplitude of the strobe signal for the on-groups. T signifies the period, and "on" and "mix" identify the strobe intervals for the on-groups and for the mixed group, respectively.

It is further apparent that the segment electrodes carry no information during the strobe interval for the on-groups because their state is known a priori. The designation of on-groups is achieved by selecting the corresponding group electrodes. The signal applied to these group electrodes can be chosen so that the display elements of the on-groups are fully activated without affecting any other groups. For example the strobe interval $\tau$ and the amplitude V in FIG. 2 can be chosen so that the effective voltage across any element of an on-group is equal to that seen by a selected element in the mixed group:

$$\sqrt{V^2 \tfrac{\tau}{T} + v^2(1 - \tfrac{\tau}{T})} = \sqrt{(1 - \tfrac{\tau}{T})(3v)^2}.$$

This yields $V^2\tau = 8v^2(T-\tau)$.

Figure 3:
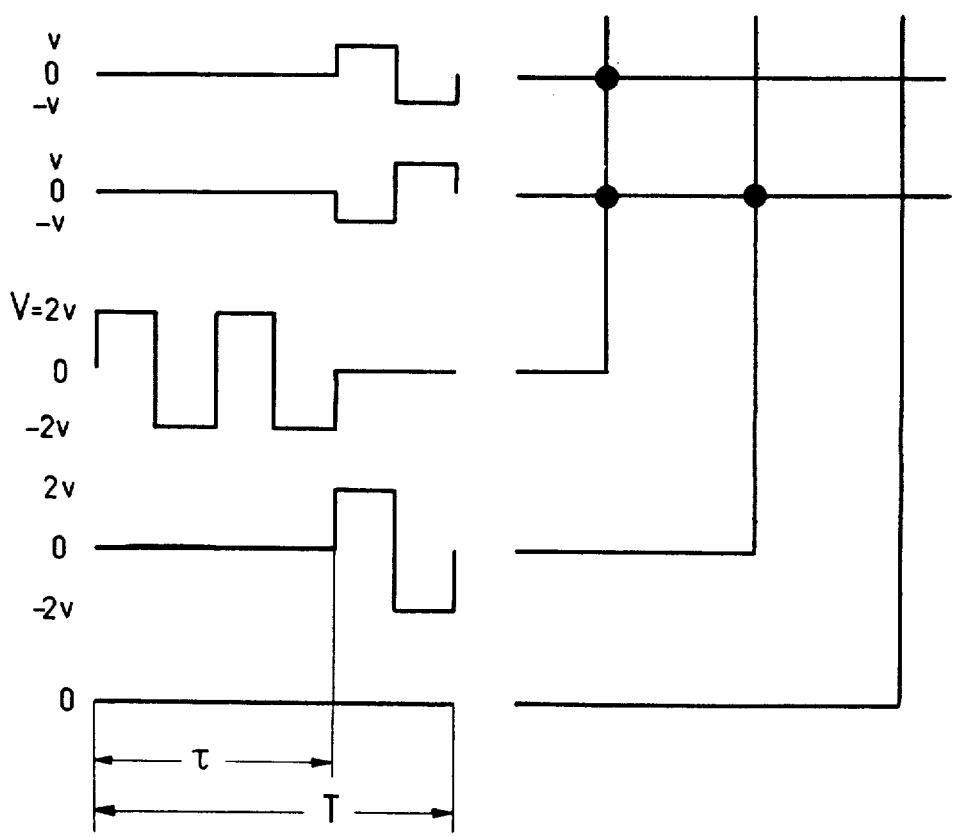
FIG. 3 shows waveforms for the addressing signals display elements in the mixed group with V=2v.
Figure 4:
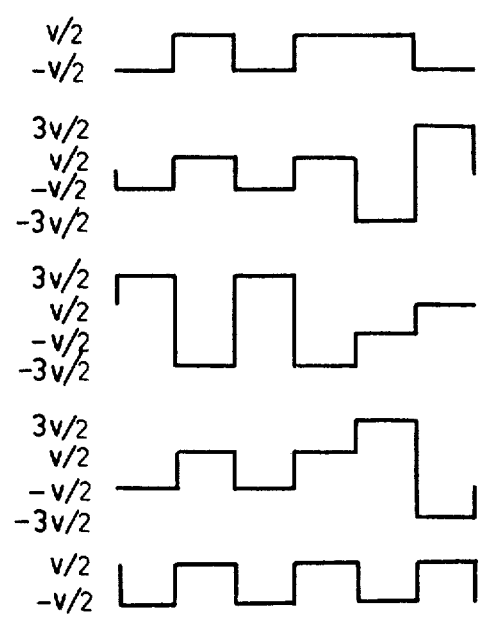
FIG. 4 shows the results of adding a square wave with amplitude −v/2 to all waveforms in FIG. 3.

The electronics required to implement this addressing scheme can be considerably simplified if one sets $V = 2v$ in order to reduce the number of voltage levels needed to address the group electrodes to three ($+2v$, 0, $-2v$). Substituting this condition into the above equation yields $\tau = \tfrac{2}{3}T$. This result is shown in FIG. 3, where also the waveforms have been changed from those of FIG. 2 to demonstrate the fact that the effective voltage is not altered by polarity reversals or by changes in the order of occurrence of the waveform segments within a period. Furthermore, the addition of some new waveform to all addressing waveforms leaves the potential difference across the liquid crystal unchanged but may simplify the electronics. This is illustrated by FIG. 4 which is obtained by adding a squarewave with amplitude $-v/2$ to all waveforms in FIG. 3; the total number of voltage levels is thereby reduced from five ($\pm 2v$, $\pm v$, 0) to four ($\pm 3v/2$, $\pm v/2$).

Considering the effective voltage across unselected elements in this addressing scheme and setting this equal to the threshold voltage $V_t$ leads to $$v^2 T - \tau/T = V_t^2.$$

Having noted above that setting $V = 2v$ leads to the strobe interval $\tau$ being $2T/3$, it will be apparent that a further implication is $$v^2 = 3V_t^2 \text{ or } v = \sqrt{3} \cdot V_t.$$

Figure 1:
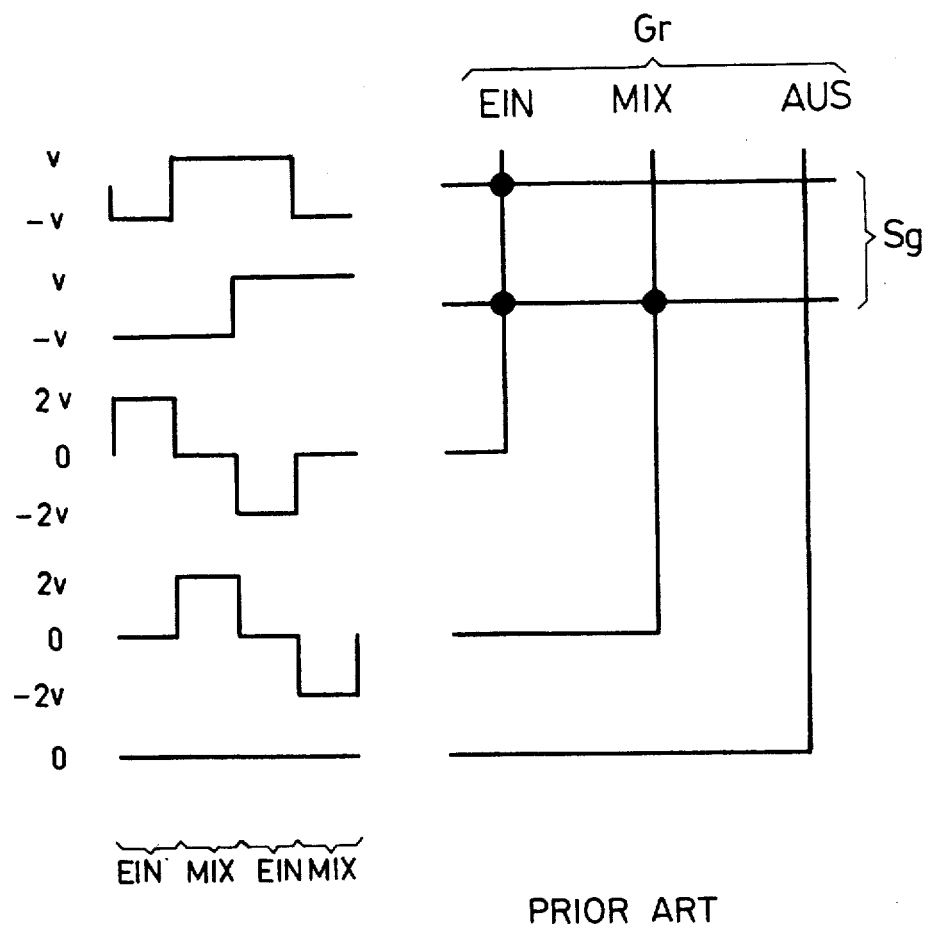
FIG. 1 shows typical waveforms for a prior art addressing scheme.

Between FIG. 1 (prior art) and FIG. 3, there exist the following differences:

(1) With FIG. 1 the maximum contrast is reached for $v = V_t$, while with FIG. 3 all amplitudes are larger by the factor $\sqrt{3}$.

(2) The duty ratio $T - \tau/T$ of the group signal for the mixed group in FIG. 1 is 1:2, while in FIG. 3 the ratio 1:3 is optimal.

(3) The segment signals in FIG. 1 are composed of two voltage levels while those in FIG. 3 are composed of three voltage levels.

(4) The maximum possible voltage discrimination ratio between on and off elements in FIG. 1 is $\sqrt{5}$, whereas in FIG. 3 it is 3.

It is sometimes desirable to connect several bargraphs as a single matrix, addressing all on-groups alike and all off-groups alike and multiplexing the several mixed groups. (See A. R. Kmetz, "A twisted nematic dual bargraph system", SID International Symposium Digest (1977) 58). This principle can also be implemented advantageously according to the present invention. Again setting $V = 2v$, one obtains for n mixed groups:

| n | $\tau/T = \dfrac{2}{2+n}$ | $G = \sqrt{\dfrac{8}{n} + 1}$ |
|---|---|---|
| 1 | ⅓ | 3 |
| 2 | ½ | 2.24 |
| 3 | 2/5 | 1.91 |
| 4 | ⅓ | 1.73 |
| 8 | 1/5 | 1.41 |

FIG. 5 shows the case $n = 2$, a dual bargraph whose two bars are labelled respectively A and B.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A process for the display of measured quantities as a bargraph with the help of a row of addressable display elements, comprising the steps of:
   interconnecting the display elements on one side into contiguous groups and on the other side according to like position within each group;
   addressing in a rapid alternation imperceptible to the eye of a beholder either the on-groups, in which all display elements are to be excited, or the mixed group, in which only a part of the display elements are to be excited; and
   maintaining the amplitude of the driving voltage across display elements in the mixed group zero during the strobe interval for the on-groups.

2. The process recited in claim 1 including the step of:
   maintaining the amplitude (v) of the strobe signal for the on-groups twice the amplitude (v) of the signal on the segment electrodes during the strobe interval for the mixed group.

3. The process recited in claim 2 including the step of:
   adding to all addressing waveforms a rectangular waveform with amplitude ($-v/2$) equal to half that of the signal applied to the segments.

4. The process recited in claims 1, 2 or 3 including the steps of:
   interconnecting several bargraphs as a single matrix;
   addressing all on-groups alike;
   addressing all off-groups alike; and
   addressing the various mixed groups by multiplexing.

* * * * *